(12) United States Patent
Ku et al.

(10) Patent No.: US 9,742,082 B1
(45) Date of Patent: Aug. 22, 2017

(54) CONNECTION STRUCTURE OF ELECTRONIC COMPONENTS AND CIRCUIT BOARD

(71) Applicant: Delta Electronics, Inc., Taoyuan (TW)

(72) Inventors: Chen-Wei Ku, Taoyuan (TW);
Yao-Chien Lin, Taoyuan (TW);
Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/454,683

(22) Filed: Mar. 9, 2017

(30) Foreign Application Priority Data

Aug. 15, 2016 (TW) ................................. 105125893

(51) Int. Cl.
*H01R 12/00* (2006.01)
*H01R 12/70* (2011.01)
*H05K 1/11* (2006.01)
*H05K 7/14* (2006.01)
(Continued)

(52) U.S. Cl.
CPC ..... *H01R 12/7076* (2013.01); *H01R 13/6215* (2013.01); *H05K 1/115* (2013.01); *H05K 1/181* (2013.01); *H05K 7/1427* (2013.01); *H05K 2201/10409* (2013.01)

(58) Field of Classification Search
CPC .. H01R 12/716; H01R 13/6215; H01R 12/58; H01R 13/6658; H05K 7/1427; H05K 1/115; H05K 1/181; H05K 2201/10409
See application file for complete search history.

(56) References Cited

U.S. PATENT DOCUMENTS

| 6,142,831 | A  | * | 11/2000 | Ashman | .................. | H01R 13/66 439/607.46 |
| 7,182,655 | B2 | * | 2/2007  | Chen   | ...................... | H01R 4/028 174/261 |

(Continued)

FOREIGN PATENT DOCUMENTS

WO    2013065586 A1    5/2013

OTHER PUBLICATIONS

Office Action dated Apr. 13, 2017 of the corresponding Taiwan patent application.

*Primary Examiner* — Xuong Chung Trans
(74) *Attorney, Agent, or Firm* — Chun-Ming Shih; HDLS IPR Services

(57) ABSTRACT

An electrical connection of an electronic component, such as an inductor, and a circuit board is implemented as follows. The circuit board has a through-hole and is located at a distance from an inner bottom surface of the case. An electronic component is around the through-hole and between the inner bottom surface and the circuit board. The electronic component has a conducting wire and a conducting plate. The conductive connector is between the through-hole and the conducting plate and electrically connected to the conducting plate. The electronic component is electrically connected to the circuit board through the conductive connector. The insulated connector corresponds to the conductive connector and is between the conducting plate and the inner bottom surface. The fastener is connected to the conductive connector through the through-hole. Thus, a good electrical connection between the electronic component and the circuit board is achieved.

15 Claims, 6 Drawing Sheets

(51) Int. Cl.
*H05K 1/18* (2006.01)
*H01R 13/621* (2006.01)

(56) References Cited

U.S. PATENT DOCUMENTS

| | | | |
|---|---|---|---|
| 8,535,100 B2 * | 9/2013 | Ge | H01R 13/6658 439/620.17 |
| 9,345,160 B2 | 5/2016 | Fukumasu et al. | |
| 2009/0176408 A1 * | 7/2009 | Wu | H01R 13/719 439/607.01 |

* cited by examiner

CONNECTION STRUCTURE OF ELECTRONIC COMPONENTS AND CIRCUIT BOARD

BACKGROUND OF THE INVENTION

Field of the Invention

The present invention relates to an electrical connection structure and in particular to a connection structure of electronic components and a circuit board.

Description of Prior Art

As for a traditional circuit board on which an electronic circuit is laid out, more electronic components are disposed on the circuit board by welding or disposed on a side of the circuit board to form electrical connection using conductive wires.

FIG. 1 shows a connection schematic of the existing electronic components such as inductors or capacitors and the circuit board, which includes a circuit board 10*a*, an inductor (Choke) 20*a*, a terminal stage 30*a*, and a fastener 40*a*. The terminal stage 30*a* is disposed on a preset position. Besides, the circuit board 10*a* is provided with a wire hole 11*a* and the inductor 20*a* has a conductive wire 21*a*. The inductor 20*a* is disposed on one side of (under) the circuit board 10*a*. When the inductor 20*a* is assembled, the conductive wire 21*a* will pass out of the wire hole 11*a* and extend to the terminal stage 30*a*. Finally, the conductive wire 21*a* is connected to the terminal stage 30*a* using the fastener 40*a*. In this way, the inductor 20*a* is electrically connected to the circuit board 10*a*.

Please refer to FIG. 2, which shows an assembled top view of the existing electronic components (e.g., inductors and capacitors) and the circuit board. As shown in FIG. 2, the conductive wire 21*a* of the inductor 20*a* passes out of the wire hole 11*a* to bend and extend to the terminal stage 30*a*. However, during the above layout process, the conductive wire 21*a* may be damaged due to the friction with the edge of the wire hole 11*a*, which results in wear of the outer insulation layer of the conductive wire 21*a* and even a wire break. In addition, the extension of the conductive wire 21*a* will occupy and affect the layouts of the circuit and other components on the circuit board 10*a*. Also, the extension length of the conductive wire 21*a* will cause EMI (Electromagnetic Interference) problems.

In view of this, the inventor pays special attention to research with the application of related theory and tries to improve and overcome the above disadvantages regarding the above related art, which becomes the improvement target of the inventor.

SUMMARY OF THE INVENTION

One objective of the present invention is to provide a connection structure of electronic components and a circuit board, which achieve a good electrical connection between the electronic components and the circuit board.

Another objective of the present invention is to provide a connection structure of electronic components and a circuit board to prevent the damage caused by the friction between the conductive wire and the wire hole and to mitigate EMI problems.

To achieve the above objectives, the present invention provides a connection structure of electronic components and a circuit board, which comprises a case, a circuit board, an electronic component, a conductive connector, an insulated connector, and a fastener. The circuit board is disposed in the case and located at a distance from an inner bottom surface of the case. The circuit board has a through-hole. The electronic component is disposed in the vicinity of the through-hole and between the inner bottom surface of the case and the circuit board. The electronic component has a conducting wire and a conducting plate electrically connected to the conducting wire. The conductive connector is disposed between the through-hole and the conducting plate and is electrically connected to the conducting plate. The electronic component is electrically connected to the circuit board through the conductive connector. The insulated connector corresponds to the conductive connector and is disposed between the conducting plate and the inner bottom surface of the case. The fastener is connected to the conductive connector through the through-hole.

Compared with the conventional electrical connection between the electronic components and the circuit, the present invention uses the conductive connector and the insulated connector as the electrical connection structure between the electronic components and the circuit board. In a practical embodiment, the conductive wire of the electronic component will not pass out of the through-hole of the circuit board to extend onto the surface of the circuit board. Thus, the space of the circuit board will not be occupied so as to affect the layouts of the circuit and other electronic components. Moreover, the electrical connection between the electronic components and the circuit board of the present invention can prevent the conductive wire from being damaged due to the friction with the wire hole and can mitigate EMI problems. As a result, the practicability of the present invention is increased.

DETAILED DESCRIPTION OF THE INVENTION

The detailed description and technical details of the present invention will be explained below with reference to accompanying drawings. However, the accompanying drawings are only for reference and explanation, but not to limit the scope of the present invention.

Figure 1:
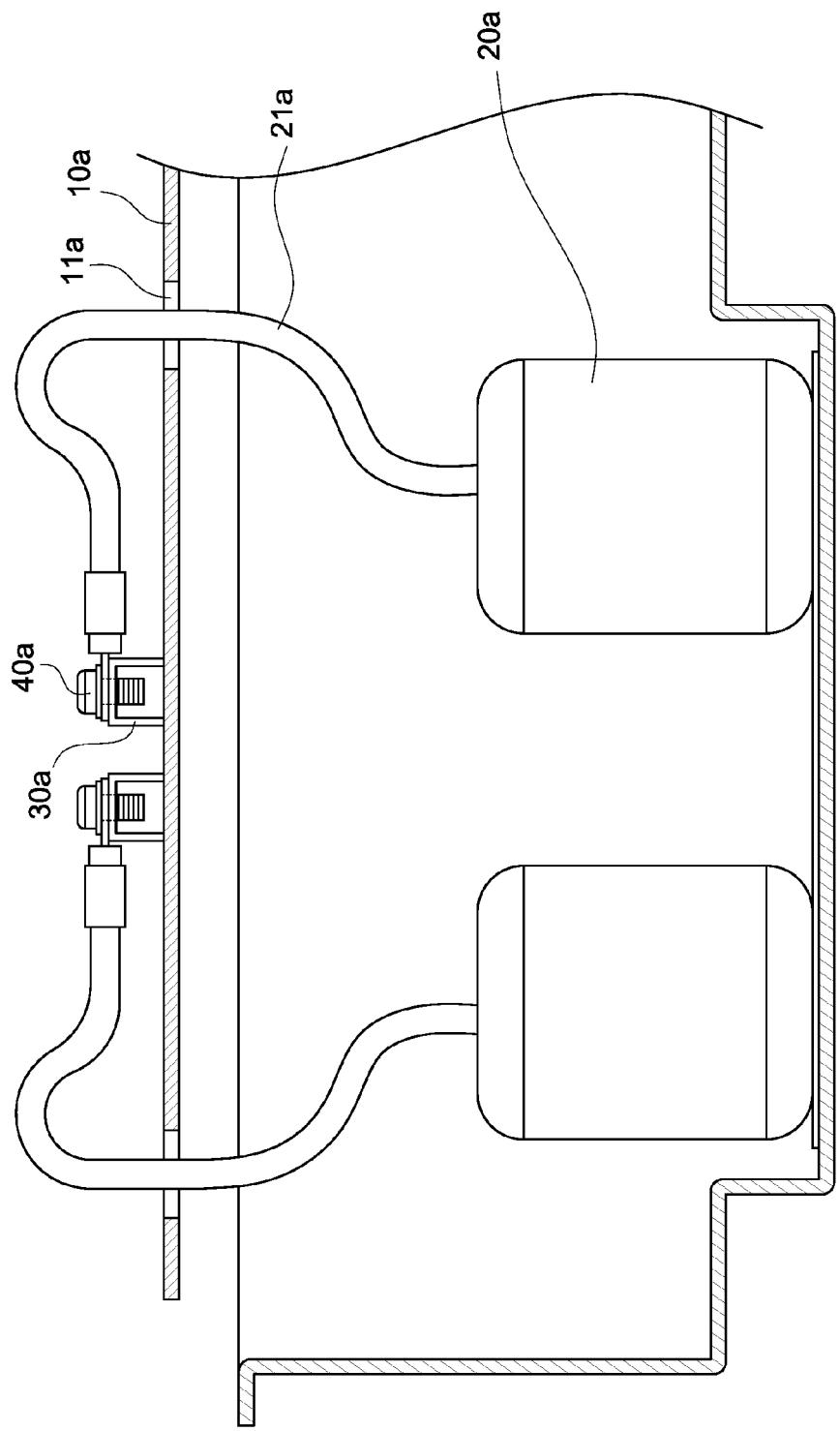
FIG. 1 shows a connection schematic of the existing electronic components and the circuit board.
Figure 2:
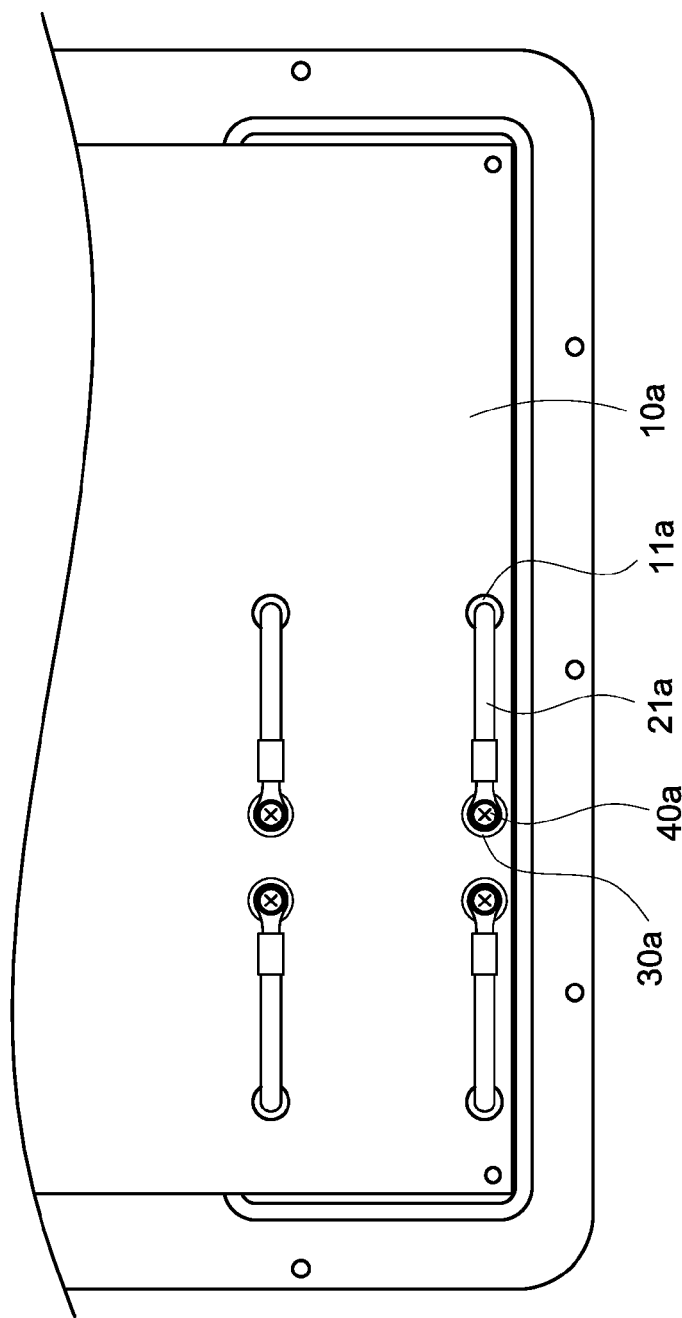
FIG. 2 shows an assembled top view of the existing electronic components and the circuit board.
Figure 3:
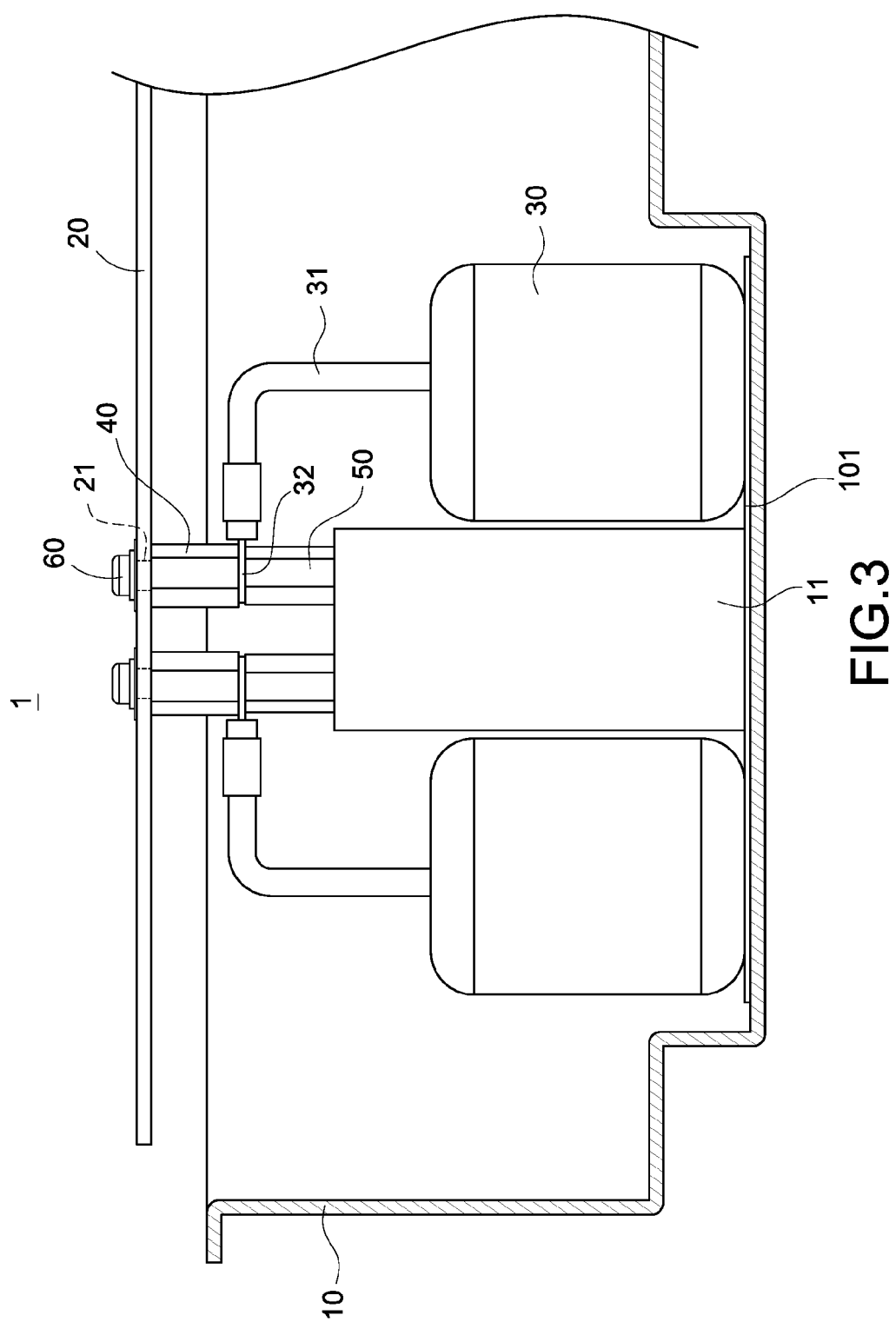
FIG. 3 shows an assembled cross-sectional view of the connection structure of electronic components and a circuit board of the present invention.
Figure 4:
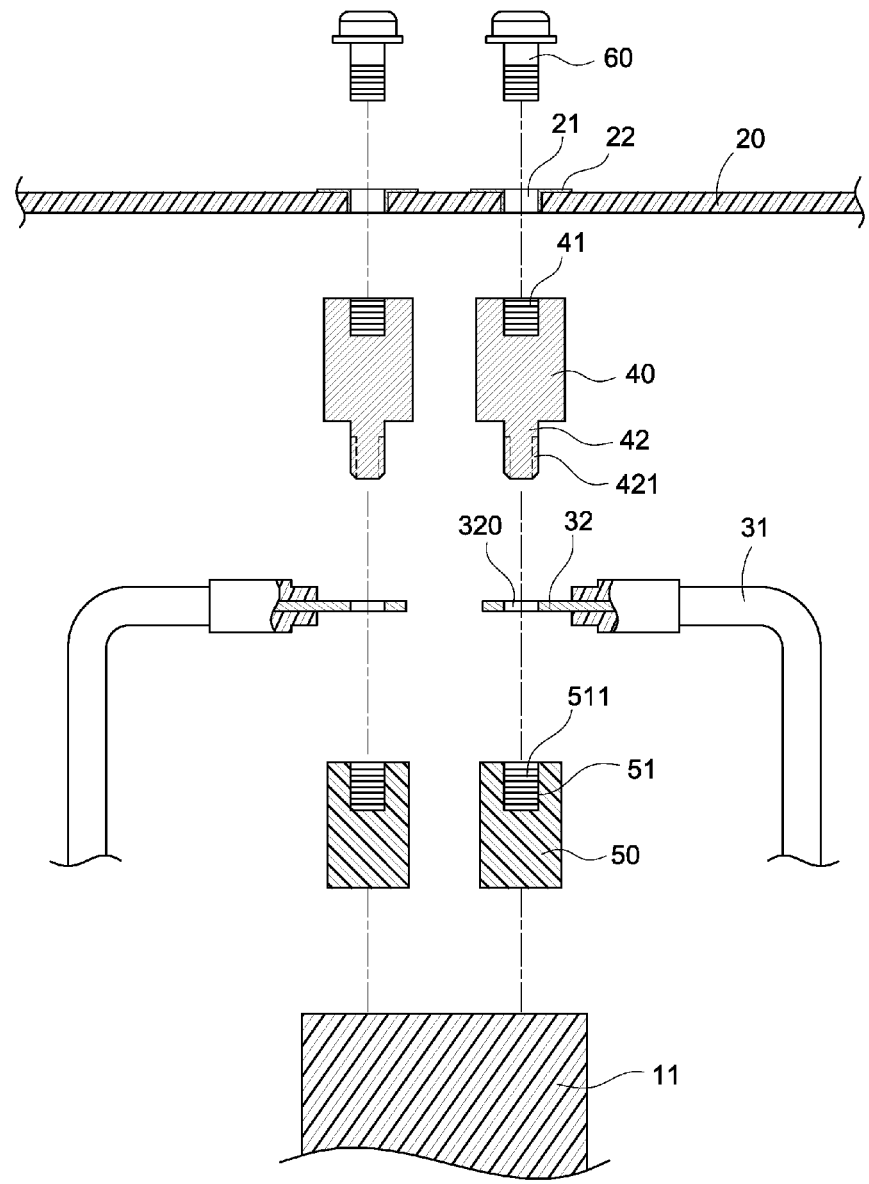
FIG. 4 shows an exploded cross-sectional view of the connection structure of the electronic components and the circuit board of the present invention.

Please refer to FIGS. 3 and 4, which show the assembled cross-sectional view and the exploded cross-sectional view of the connection structure of the electronic components and the circuit board of the present invention, respectively. The present invention provides a connection structure of electronic components and a circuit board, which comprises a case 10, a circuit board 20, an electronic component 30, a conductive connector 40, an insulated connector 50, and a fastener 60. The circuit board 20 is disposed in the case 10.

The electronic component 30 is electrically connected to the circuit board 20 by means of the dispositions of the conductive connector 40 and the insulated connector 50 and is connected to the circuit board 20 through the fastener 60.

As shown in FIG. 3, the connection structure of the electronic components and the circuit board of the present invention are applied in an electronic device 1. The electronic device 1 has the case 10 which is preferably made of metal, but not limited to this. In a practical embodiment, the case 10 can be made of materials such as plastic. In the current embodiment, a support post 11 is formed from the case 10 and is used to support the insulated connector 50 and the conductive connector 40 disposed on the insulated connector 50. In an embodiment of the present invention, the support post 11 is disposed on the inner bottom surface 101 of the case 10 and is pressed against the bottom of the insulated connector 50. The support post 11 can be formed integrally with the case 10.

The circuit board 20 is disposed in the case 10 and located at a distance from the inner bottom surface 101 of the case 10. The circuit board 20 has a through-hole 21. Also, the electronic component 30 is disposed in the vicinity of the through-hole 21 and between the inner bottom surface 101 of the case 10 and the circuit board 20. The electronic component 30 has a conducting wire 31 and a conducting plate 32 electrically connected to the conducting wire 31. The electrical connection between the electronic component 30 and the circuit board 20 is detailed as follows.

The conductive connector 40 is made of an electrically conductive material to have electrical conductivity, for example, a copper post. The conductive connector 40 is disposed between the through-hole 21 of the circuit board 20 and the conducting plate 32 of the electronic component 30 and is electrically connected to the conducting plate 32. Thus, the electronic component 30 can be electrically connected to the circuit board 20 through the conductive connector 40.

Furthermore, the insulated connector 50 is made of an electrically insulated material to have electrical insulation. The insulated connector 50 corresponds to the conductive connector 40 and is disposed between the conducting plate 32 and the inner bottom surface 101 of the case 10. In this way, an electrical insulation is provided for the conducting plate 32 such that when the case 10 is a metal case, a short circuit caused by mutual electrical conduction of the insulated connector 50 and the case 10 can be avoided. In the current embodiment, the insulated connector 50 corresponds to the conductive connector 40 and is disposed between the conducting plate 32 and the support post 11. In a practical embodiment, one end of the insulated connector 50 can extend to the inner bottom surface 101 of the case 10 (not shown). That is, the support post 11 can be omitted to simplify the structure.

Besides, the fastener 60 is connected to the conductive connector 40 through the through-hole 21 of the circuit board 20. Also, the conductive connector 40 is fixed on the bottom surface of the circuit board 20 by means of the screwing of the fastener 60. The connection between the conductive connector 40 and the insulated connector 50 is detailed as follows.

As shown in FIG. 4, in an embodiment of the present invention, the conductive connector 40 has a fixing hole 41 into which the fastener 60 is disposed. Preferably, the fastener 60 is a screw and the fixing hole 41 is a screw hole. Note that the fastening between the conductive connector 40 and the fastener 60 in not limited. In a practical embodiment, the fastener 60 can be a screw nut; the side of the conductive connector 40 facing the circuit board 20 extends to form a stud (not shown). The conductive connector 40 is connected to the screw nut by means of the stud passing through the through-hole 21. In this way, the conductive connector 40 is fixed on the bottom surface of the circuit board 20 by means of the screwing of the fastener 60.

In an embodiment of the present invention, a protrusion 42 is formed on the side of the conductive connector 40 facing the insulated connector 50; the insulated connector 50 is provided with a combining hole 51 corresponding to the protrusion 42. Also, the conducting plate 32 is provided with a hole 320 through which the protrusion 42 passes to be screwed firmly to the fixing hole 51. Note that the type of the hole 320 is not limited. In a practical embodiment, the hole 320 can be a round hole or U-shaped hole.

Further, a plurality of first threads 421 are formed on the edge surface of the protrusion 42; a plurality of second threads 511 are formed on the inner wall surface of the combining hole 51. The insulated connector 50 and the conductive connector 40 are fixed together through the screw connection between the first threads 421 and the second threads 511.

It is worth noting that, preferably, a conductive layer 22 such as copper foil is disposed on the hole wall and at the perimeter of the through-hole 21. In the current embodiment, the conductive layer 22 is disposed on the side of the circuit board 20 away from the conductive connector 40; that is, the conductive layer 22 is disposed on the hole wall and at the upper perimeter of the through-hole 21. Further, the fastener 60 is an electrically conductive screw, but not limited to this. Thus, an electrical connection between the circuit board 20 and the conductive connector 40 through the conductive layer 22 and the fastener 60 is achieved.

Figure 5:
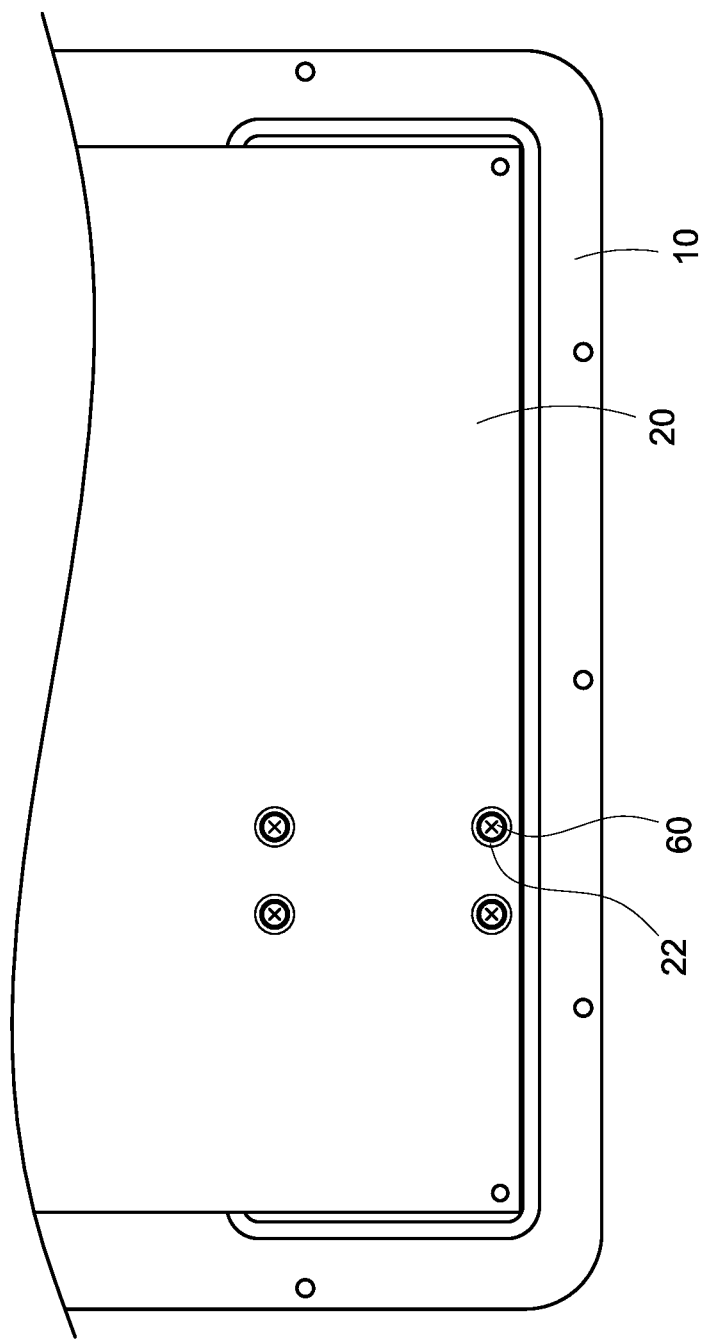
FIG. 5 shows an assembled top view of the electronic components and the circuit board of the present invention.

Please refer to FIG. 5, which shows an assembled top view of the electronic components and the circuit board of the present invention. After the circuit board 20 and the electronic component 30 are assembled together according to the above-mentioned method, only the fastener 60 passes through the through-hole 21 of the circuit board 20. In other words, the conductive wire of the electronic component 30 does not pass through the through-hole 21 to extend on the circuit board 20. Therefore, the area of the circuit board 20 will not be occupied to affect the layouts of the circuit on the circuit board 20 and other electronic components.

Figure 6:
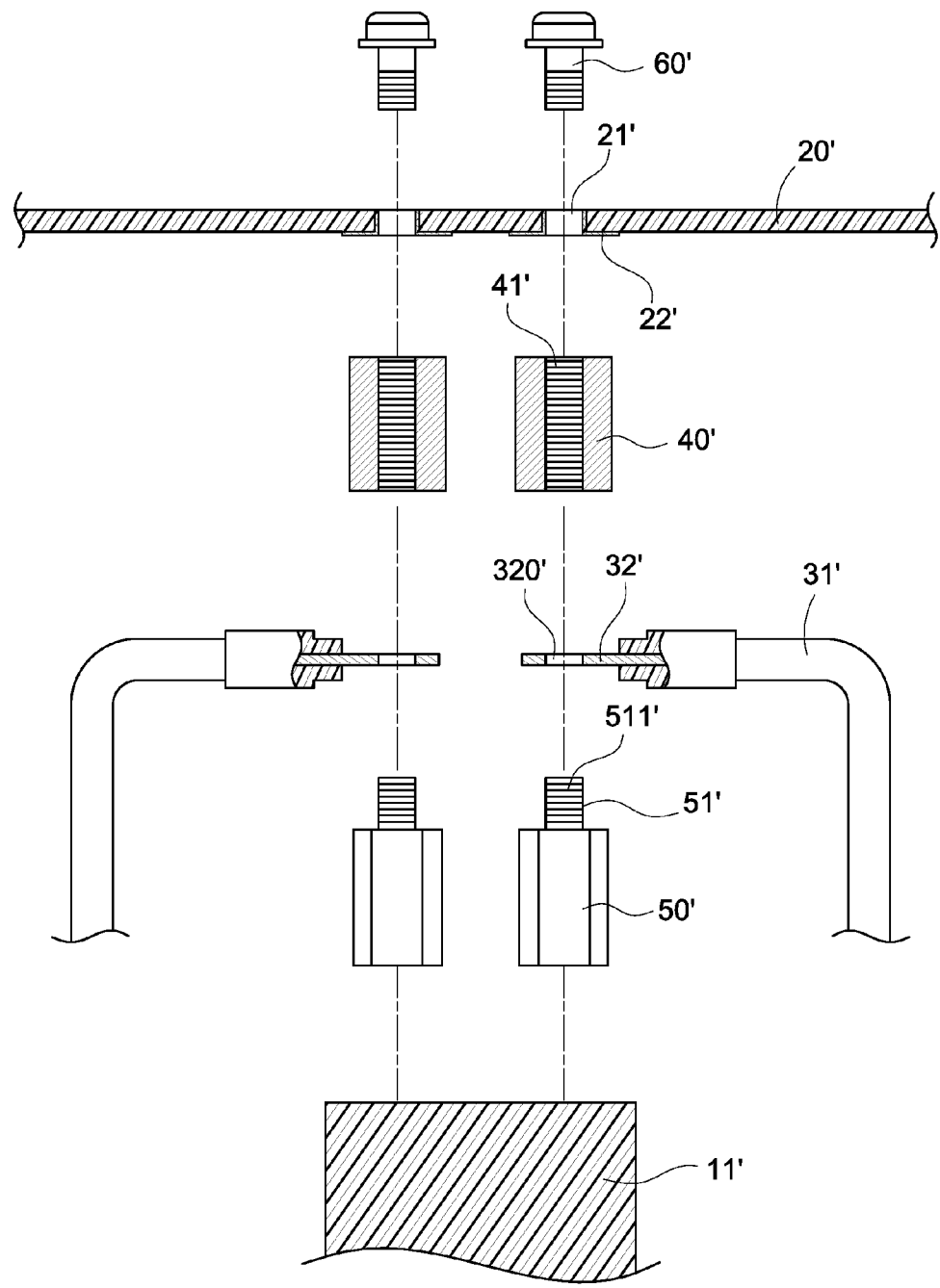
FIG. 6 shows an exploded cross-sectional view of another connection between the conductive connector and the insulated connector of the present invention.

Please also refer to FIG. 6, which shows an exploded cross-sectional view of another connection between the conductive connectors and the insulated connector of the present invention. In the current embodiment, the connection structure of the electronic components and the circuit board comprises a case (not shown), a circuit board 20', an electronic component (not shown), a conductive connector 40', an insulated connector 50', and a fastener 60'. The circuit board 20' has a through-hole 21'. The electronic component has a conducting wire 31' and a conducting plate 32'. Besides, the conductive connector 40' and insulated connector 50' are disposed on the support post 11'. The electronic component is electrically connected to the circuit board 20' by means of the dispositions of the conductive connector 40' and the insulated connector 50' and is connected to the circuit board 20' through the fastener 60'. The difference between the current embodiment and the previous embodiment is the connection between the conductive connector 40' and the insulated connector 50'.

In the current embodiment, the conductive connector 40' has a fixing hole 41' into which the fastener 60' is disposed. Preferably, the fastener 60' is a screw and the fixing hole 41' is a screw hole, but not limited to this when in practice. Also, the fixing hole 41' penetrates through the conductive connector 40'; the insulated connector 50' is provided with a protrusion 51' corresponding to the fixing hole 41'. The conducting plate 32' is provided with a hole 320' through which the protrusion 51' passes to be screwed firmly to the fixing hole 41'. Besides, a plurality of threads 511' are formed on the edge surface of the protrusion 51'; the insulated connector 50' and the conductive connector 40' are fixed together through the screw connection between the protrusion 51' and the fixing hole 41'.

Note that a conductive layer 22' is disposed on the hole wall and at the perimeter of the through-hole 21' of the circuit board 20'. In the current embodiment, the conductive layer 22' is disposed on the side of the circuit board 20' facing the conductive connector 40'; that is, the conductive layer 22' is disposed on the hole wall and at the lower perimeter of the through-hole 21'. Because the conductive connector 40' is attached at the lower perimeter of the through-hole 21' and is directly electrically connected to the circuit board 20', the fastener 60' does not have to be made of an electrically conducting material such that a direct and electrical connection between the circuit board 20' and the conductive connector 40' can be achieved directly by the conductive layer 22'.

The embodiments disclosed in the description are only preferred ones of the present invention, but not to limit the scope of the present invention. All variations regarding the above structure and device according to the claimed scope of the present invention should be embraced by the scope of the appended claims of the present invention.

What is claimed is:

1. A connection structure, comprising:
   a case;
   a circuit board disposed in the case and located at a distance from an inner bottom surface of the case, wherein the circuit board has a through-hole;
   an electronic component disposed around the through-hole and between the inner bottom surface of the case and the circuit board, wherein the electronic component has a conducting wire and a conducting plate electrically connected to the conducting wire;
   a conductive connector disposed between the through-hole and the conducting plate and electrically connected to the conducting plate, wherein the electronic component is electrically connected to the circuit board through the conductive connector;
   an insulated connector corresponding to the conductive connector and disposed between the conducting plate and the inner bottom surface of the case; and
   a fastener connected to the conductive connector through the through-hole.

2. The connection structure according to claim 1, wherein the case is made of metal.

3. The connection structure according to claim 1, wherein a support post is formed from the case, and the support post is pressed against the bottom of the insulated connector.

4. The connection structure according to claim 1, wherein a conductive layer is disposed at the perimeter of the through-hole of the circuit board.

5. The connection structure according to claim 1, wherein the conductive connector has a fixing hole into which the fastener is disposed.

6. The connection structure according to claim 5, wherein the fastener is a screw, and the fixing hole is a screw hole.

7. The connection structure according to claim 6, wherein the fixing hole penetrates through the conductive connector, and the insulated connector is provided with a protrusion corresponding to the fixing hole.

8. The connection structure according to claim 7, wherein a plurality of threads are formed on the edge surface of the protrusion, and the insulated connector and the conductive connector are fixed together through the screw connection between the protrusion and the fixing hole.

9. The connection structure according to claim 7, wherein the conducting plate is provided with a hole through which the protrusion passes to be screwed firmly to the fixing hole.

10. The connection structure according to claim 1, wherein a protrusion is formed on a side of the conductive connector facing the insulated connector, and the insulated connector is provided with a combining hole corresponding to the protrusion.

11. The connection structure according to claim 10, wherein a plurality of first threads are formed on the edge surface of the protrusion, a plurality of second threads are formed on the inner wall surface of the combining hole, and the insulated connector and the conductive connector are fixed together through the screw connection between the first threads and the second threads.

12. The connection structure according to claim 1, wherein the conductive connector is a copper post.

13. The connection structure according to claim 1, wherein the fastener is an electrically conductive screw.

14. The connection structure according to claim 1, wherein the fastener is a screw nut, a side of the conductive connector facing the circuit board extends to form a stud, and the conductive connector is connected to the screw nut by means of the stud passing through the through-hole.

15. The connection structure according to claim 1, wherein an end of the insulated connector extends directly to the inner bottom surface of the case.

* * * * *